United States Patent [19]

Reinelt et al.

[11] Patent Number: 4,780,638

[45] Date of Patent: Oct. 25, 1988

[54] METHOD AND SYSTEM FOR THE PRODUCTION OF ELECTRICAL ENERGY BY MEANS OF A PRESSURE MEDIUM

[76] Inventors: Werner Reinelt, Am Hang 3, D-4630 Bochum; Guy Geuns, Ringstrasse 1, D-8551 Hemhofen; Karl Krieger, deceased, late of Wuppertal; by Hildegard Krieger, legal representative, Domagkweg 66, 5600 Wuppertal 1, all of Fed. Rep. of Germany

[21] Appl. No.: 62,834

[22] Filed: Jun. 16, 1987

[30] Foreign Application Priority Data

Jun. 20, 1986 [DE] Fed. Rep. of Germany ....... 3620752

[51] Int. Cl.$^4$ .............................................. H01L 41/08

[52] U.S. Cl. .................................... 310/339; 310/311; 310/317; 310/319

[58] Field of Search ............... 310/321, 323, 328, 338, 310/339, 311, 316–319

[56] References Cited

U.S. PATENT DOCUMENTS

| | | | |
|---|---|---|---|
| 2,522,389 | 9/1950 | Mason | 310/339 X |
| 3,215,133 | 11/1965 | Farrell | 310/339 X |
| 3,337,758 | 8/1967 | Brothers | 310/339 X |
| 3,350,583 | 10/1967 | Schiavone | 310/339 X |
| 3,354,327 | 11/1967 | Benson | 310/339 |
| 3,865,539 | 2/1975 | Burge, Jr. et al. | 310/339 X |
| 4,467,236 | 8/1984 | Kolm et al. | 310/339 X |
| 4,511,818 | 4/1985 | Benjamin et al. | 310/339 X |
| 4,595,856 | 6/1986 | Glomb, Jr. | 310/339 |
| 4,651,045 | 3/1987 | Wagner | 310/339 X |

OTHER PUBLICATIONS

Biologically-Energized Cardiac Pacemakers, by Myers et al., *American Journal of Medical Electronics*, Oct.–Dec. 1964, pp. 233–236.

*Primary Examiner*—Mark O. Budd
*Attorney, Agent, or Firm*—Berman, Aisenberg & Platt

[57] ABSTRACT

The invention relates to a method and system for supplying devices which are charged with a fluid pressure medium as a working medium with electrical energy for actuating electrical parts of the device, wherein an energy converter is subjected to the fluid pressure medium in such a way that a fraction of the energy of the fluid pressure medium is converted into electrical energy which is then stored in an electric store.

1 Claim, 1 Drawing Sheet

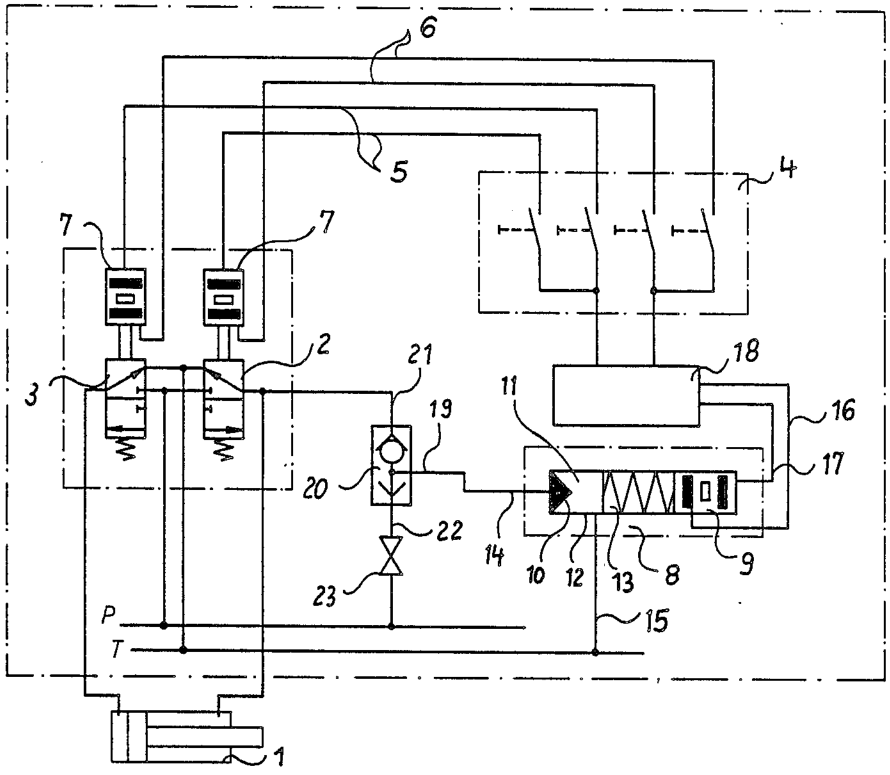
6
5
4
7
7
2
3
21
18
11
19
16
17
20
22
14
10
12
13
8
9
23
P
T
15
1

METHOD AND SYSTEM FOR THE PRODUCTION OF ELECTRICAL ENERGY BY MEANS OF A PRESSURE MEDIUM

This invention relates to a method and a system for supplying devices which are charged with a fluid pressure medium as a working medium with electrical energy for actuating electrical parts, especially electrical control means of the device.

In underground workings—for example in longwall mine galleries—it is usual for a plurality of mine-roof support assemblies to be individually actuated hydraulically. For this purpose there extends along the longwall gallery an hydraulic supply conduit, comprising a pressure conduit and a reservoir conduit, to which the roof-support assemblies are connected. The control of the individual roof-support assemblies is effected through electrical/electronic control means which, in turn, are connected to a common electric current supply lead extending through the gallery. A multiplicity of different leads and conduits in the gallery is undesirable, while a single current supply lead in the gallery—which may have to carry a power requirement in the gallery of at least 1 kw. for about 250 support assemblies—causes problems on account of the spark danger. Similarly, in other non-mining installations which likewise include devices operated by a fluid pressure medium, the multiplicity of necessary supply leads and conduits is disadvantageous if these devices comprise additional electrical and/or electronic control systems.

The aim of the present invention therefore is to produce a method and a system whereby the electrical current supply lead can be eliminated from such installations.

With this aim in view, the invention is directed, in one of its aspects, to a method for supplying devices which are charged with a fluid pressure medium as a working medium with electrical energy for actuating electrical parts of the device, wherein an energy converter is subjected to the action of the fluid pressure medium whereby a fraction of the energy of the pressure medium is converted into electrical energy.

From another aspect, the invention is directed to a system for supplying devices which are charged with a fluid pressure medium as a working medium with electrical energy for actuating electrical parts of the device, wherein the system comprises a fluid pressure conduit connected to an energy converter for converting a fraction of the energy of the pressure medium in the conduit into electrical energy, the electrical output side of the energy converter being connected to an electric store.

Thus, in accordance with the invention, a partial conversion takes place of the energy present in the fluid pressure medium into electical energy, and this occurs at the actual site or place where the electrical energy is required. This means that the electrical energy is generated at the points(s) of use, and in fact by means of the fluid pressure medium with which the device is charged. In other words, a decentralised current generation takes place at the place of need by conversion of a part of the energy of the pressure medium. The fraction of the energy of the pressure medium which is thus consumed needs to be adequate for the current supply but it will normally be so slight that the energy of the pressure medium is not decisively reduced and the pressure medium is not itself consumed.

An example of a system in accordance with the invention is illustrated in the accompanying drawing in which:

The single FIGURE shows the exemplified system in circuit form.

The illustrated control system comprises a cylinder-and-piston unit 1—for example of a mine-roof support assembly as used in the underground workings of longwall mine galleries. This cylinder-and-piston unit 1 is charged with an hydraulic fluid pressure medium which is supplied through a pressure conduit P and returned through a return conduit T. The hydraulic fluid can be, for example, an oil-in-water mixture or water being pumped in the underground workings. In underground workings, by way of example, a pressure of about 300 bars may be present in the pressure conduit P, and up to about 250 roof-support assemblies per longwall gallery can be connected to the pressure conduit P. A pump (not shown) for generating the pressure in the fluid pressure conduit P has for example a power of about 130 kw.

The cylinder-and-piston unit 1 is controlled through two 3-port, 2-position directional control valves 2 and 3, that is to say, it is connected either to the return conduit T (its rest position, as illustrated) or to the pressure conduit P (its working position). Other directional control valves can also be used. The 3/2 control valves 2, 3 are controlled electrically through an electrical/electronic control unit 4 and, via electrical control conduit 5 and 6, through respective actuating members 7 which can be electro-magnets, piezo-electric elements, electric motors or other electrical actuators. In the case where the system is used in underground workings, it is essential that these actuating members 7 require a relatively low electric power for actuation so that it is possible to work in the intrinsically safe range. For example, a power consumption of 0.1 to 1 watt per control unit 4 would be standard. In the specific embodiment of the invention illustrated, the actuating members 7 comprise piezo-electric elements, while the control unit 4 has two switches each provided with two switch contacts. The control unit 4 could, however, equally well be constructed as an electronic control system and comprise a data detection and storage system or the like.

An essential component of the illustrated control system is an energy conversion unit 8 for the generation of electric energy from the energy of fluid pressure medium, preferably the hydraulic pressure medium used in the cylinder-and-piston unit 1. In the embodiment shown, the unit 8 comprises a piezo-electric element 9 preceded by an hydraulic vibrator 10. This hydraulic vibrator 10 has a piston 11 which is guided displaceably in a cylinder 12 against the force of a compression spring 13. The spring 13 is supported at one end on the piezo-electric element 9.

On the side of the piston 11 remote from the spring 13, a fluid pressure inlet 14 is arranged in the respective end of the cylinder 12, and on the other side of the piston, beyond the spring 13, the piezo-electric element 9 is charged through the spring by the pressure present in the cylinder 12. A fluid outlet conduit 15 opens laterally into the cylinder 12 at a predetermined distance from the inlet 14. This outlet conduit 15 is connected to the return conduit T. The electric voltage outputs 16 and 17 of the piezo-electric element 9 are connected to an electric store 18 which, in turn, is connected to the control unit 4. The voltage of the piezo-electric element appearing on the outputs 16, 17 is thus stored in the electric store 18. The fluid pressure inlet 14 is connected to the outlet 19 of an hydraulic change-over valve 20 which has two inlets 21, 22 connected to the fluid pressure conduit P. As will be seen, the inlet 22 is connected directly to the conduit P while the inlet 21 is connected indirectly by way of the 3/2 directional control valves 2 and 3. A shut-off cock or valve 23 is installed between the inlet 22 and the pressure conduit P.

The manner of operation of the system described above is as follows:

Due to the pressure present in the fluid pressure conduit P and to the fluid inlet 14 being connected by way of the inlet 21 of the change-over valve 20 and the opened shut-off cock 23 to the pressure conduit P, fluid pressure corresponding to that in the conduit P is present in the cylinder 12. This fluid pressure in the cylinder 12 acts on the piezo-electric element 9 and, through the piston 11, on the spring 13 so that the latter is compressed until the piston 11 has moved past the outlet conduit 15 to permit hydraulic pressure medium present in the cylinder 12 to flow out through the outlet conduit 15 into the return conduit T. This outflow of hydraulic fluid causes the pressure in the cylinder 12 to fall off, with the result that the spring expands and moves the piston 11 back towards the inlet 14. The piston thus shuts off the outlet conduit 15 from the cylinder interior, thereby allowing the pressure in the pressure conduit P to build up again in the cylinder 12 in the space between the inlet 14 and the piston 11, whereupon the above action is repeated.

Due to the fluid pressure acting on the piezo-electric element 9 through the hydraulic vibrator 10, the element 9 generates an electric voltage in pulse form which appears on the outputs 16, 17 and is stored (i.e., the individual pulses are totalled) in the store 18 which can be an accumulator, a battery or a capacitance such as a condenser. The electrical energy stored in the store 18 is now used to operate the electric actuators 7 of the 3/2 directional control valves 2, 3 through the electrical/electronic control unit 4 and the leads 5 and 6. In the piezo-elements of the actuators 7 the electric voltage applied to these elements is converted into mechanical energy, namely kinetic energy, serving for the actuation of the 3/2 directional control valves 2, 3 so that these valves are brought into their working positions wherein the input 21 of the change-over valve 20 is connected to the fluid pressure conduit P by way of the 3/2 directional control valves. This causes the change-over valve 20 to close the input 22 which is without pressure by reason of the closure of the shut-off cock 23. The opening of the shut-off cock 23 takes place only initially in order to charge up the electric store 18 for the first switching action. Once the inlet 14 is connected to the fluid pressure conduit P by way of the input 22 and the 3/2 directional control valves 2 and 3, then the electric store 18 charges itself up constantly so that sufficient electrical energy is always present in the store to effect operation of the electrical actuators 7.

Various modifications can be made to the specific system illustrated in the drawing. In particular, it is possible to provide a plurality of individual energy converters 8 in parallel, and it is also feasible for the converter, or each converter, to have more than one piezo-electric element 9.

We claim:

1. An hydraulically-operated mine-roof support comprising:

(a) an hydraulic piston-and-cylinder unit provided with a fluid inlet and a fluid outlet for the supply and withdrawal of pressurised fluid to and from the cylinder of the unit;

(b) a fluid pressure conduit and an energy converter connected to the conduit for converting a fraction of the energy of the pressure medium in the conduit into electrical energy, the electrical output side of the energy converter being connected to an electric store and the converter comprising at least one piezo-electric element and an hydraulic pressure vibrator having a piston;

(c) an energy converter cylinder containing the piston and the piezo-electric element with a compression spring being compressibly arranged between the piston and the piezo-electric element;

(d) a fluid outlet conduit opening into an interior space of the energy converter cylinder at a position such that, after the compression spring has been compressed by the piston, the fluid outlet conduit lies between the piston and a fluid pressure inlet in the cylinder, while, after the compression spring has expanded, the piston shuts off the outlet conduit;

(e) a power output connection on the electric store connected to a control unit, the control unit being electrically connected to an electrically-operated valve actuator;

(f) at least one fluid pressure control valve under the control of the valve actuator, the valve comprising a 3-port, 2-position directional control valve connected for the supply and withdrawal of hydraulic fluid to the hydraulic piston-and-cylinder unit and having a fluid pressure inlet connected to the fluid pressure conduit and a fluid pressure outlet connected to a return conduit and to the fluid pressure inlet of the hydraulic vibrator; and (g) a change-over valve between the fluid pressure outlet of the control valve and the inlet of the hydraulic vibrator, the change-over valve having an inlet connected to the fluid pressure conduit through a shut-off cock.

* * * * *